Figure 1:
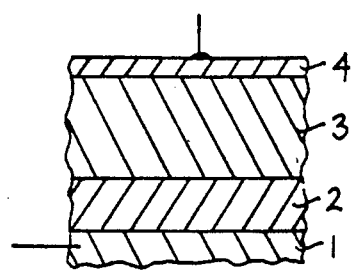

United States Patent [19]

Owen et al.

[11] Patent Number: 4,684,972
[45] Date of Patent: Aug. 4, 1987

[54] NON-VOLATILE AMORPHOUS SEMICONDUCTOR MEMORY DEVICE UTILIZING A FORMING VOLTAGE

[75] Inventors: Alan E. Owen, Edinburgh, Scotland; Gerard Sarrabayrouse, Tolouse, France; Peter G. LeComber; Walter E. Spear, both of Dundee, Scotland

[73] Assignee: The British Petroleum Company, P.L.C., London, England

[21] Appl. No.: 748,125

[22] Filed: Jun. 24, 1985

Related U.S. Application Data

[63] Continuation of Ser. No. 405,395, Aug. 5, 1982, abandoned.

[30] Foreign Application Priority Data

Aug. 7, 1981 [GB] United Kingdom ............... 8124248

[51] Int. Cl.$^4$ ............................................. H01L 45/00
[52] U.S. Cl. ......................................... 357/59; 357/2; 357/57; 357/63
[58] Field of Search ........................... 357/2, 57, 63, 59

[56] References Cited

U.S. PATENT DOCUMENTS

| | | | |
|---|---|---|---|
| 3,571,670 | 3/1971 | Ovshinsky | 357/2 |
| 3,571,672 | 3/1971 | Ovshinsky | 357/2 |
| 3,571,873 | 3/1971 | Ovshinsky | 357/2 |
| 3,740,620 | 6/1973 | Agusta et al. | |
| 3,758,797 | 9/1973 | Peterson et al. | 357/2 X |
| 3,761,896 | 9/1973 | Davidson | 357/2 X |
| 3,796,931 | 3/1974 | Maute | 357/2 |
| 4,064,521 | 12/1977 | Carlson | |
| 4,177,474 | 12/1979 | Ovshinsky | 357/63 X |
| 4,203,123 | 5/1980 | Shanks | |
| 4,226,643 | 10/1980 | Carlson | 357/2 X |
| 4,455,495 | 6/1984 | Masuhara et al. | |
| 4,464,415 | 8/1984 | Yamazaki | |

FOREIGN PATENT DOCUMENTS

| | | | |
|---|---|---|---|
| 1231824 | 1/1967 | Fed. Rep. of Germany | 357/2 |
| 3036869 | 4/1981 | Fed. Rep. of Germany | |
| 3000905 | 7/1981 | Fed. Rep. of Germany | |
| 0113296 | 7/1982 | Japan | 357/2 |
| 1300528 | 12/1972 | United Kingdom | |
| 1365598 | 9/1974 | United Kingdom | |
| 2034518 | 6/1980 | United Kingdom | |
| 2066566 | 7/1981 | United Kingdom | 357/2 |

OTHER PUBLICATIONS

Akiba et al., "Asymmetric Switching and Memory Characteristics in Amorphous Semiconductor", *Japan J. Appl. Phys.*, vol. 13, (1974), No. 5, pp. 915–916.
Switching and Memory in ZnSe—Ge Heterojunctions, H. J. Hovel, Applied Physics Letters, vol. 17, No. 4, pp. 141–143, Aug. 15, 1970.
Switching in Hydrogenated Amorphous Silicon, Gabrial and Adler, Journal of Non—Crystalline Solids 48, (1982), 297–305.
Switching and Memory Characteristics of ZnSe—Ge Heterojunctions, Hovel and Urgell, Journal of Applied Physics, vol. 42, No. 12, Nov. 1971.
Japanese Journal of Applied Physics, vol. 13, No. 5, 1974, pp. 915–916, Akiba.
Journal of Applied Physics, vol. 46, No. 5, May 1975, American Institute of Physics, S. Purkiss et al.

*Primary Examiner*—William D. Larkins
*Assistant Examiner*—William A. Mintel
*Attorney, Agent, or Firm*—Dann, Dorfman, Herrell & Skillman

[57] ABSTRACT

A semiconductor device comprising superimposed layers of p- and n-doped semiconducting material (e.g. silicon) and electrical contact means for applying an electrical potential across the superimposed layers is characterized in that the p- and n-doped layers are both of amorphous semiconducting mateial (e.g. silicon) and one of said layers is much more heavily doped than the other. Suitably the less heavily doped layer has a thickness which is not greater than 2 $\mu$m and the dopant concentration in the more heavily doped layer is one hundred or more times the dopant concentration of the less heavily doped layer. Preferably a third or quasi-intrinsic layer or substantially undoped amorphous semiconducting material (e.g. silicon) or electrically insulating material is applied to one of the doped layers between that layer and its electrical contact means. The device can be used as an electrically-programmable non-volatile semiconductor memory device.

29 Claims, 8 Drawing Figures

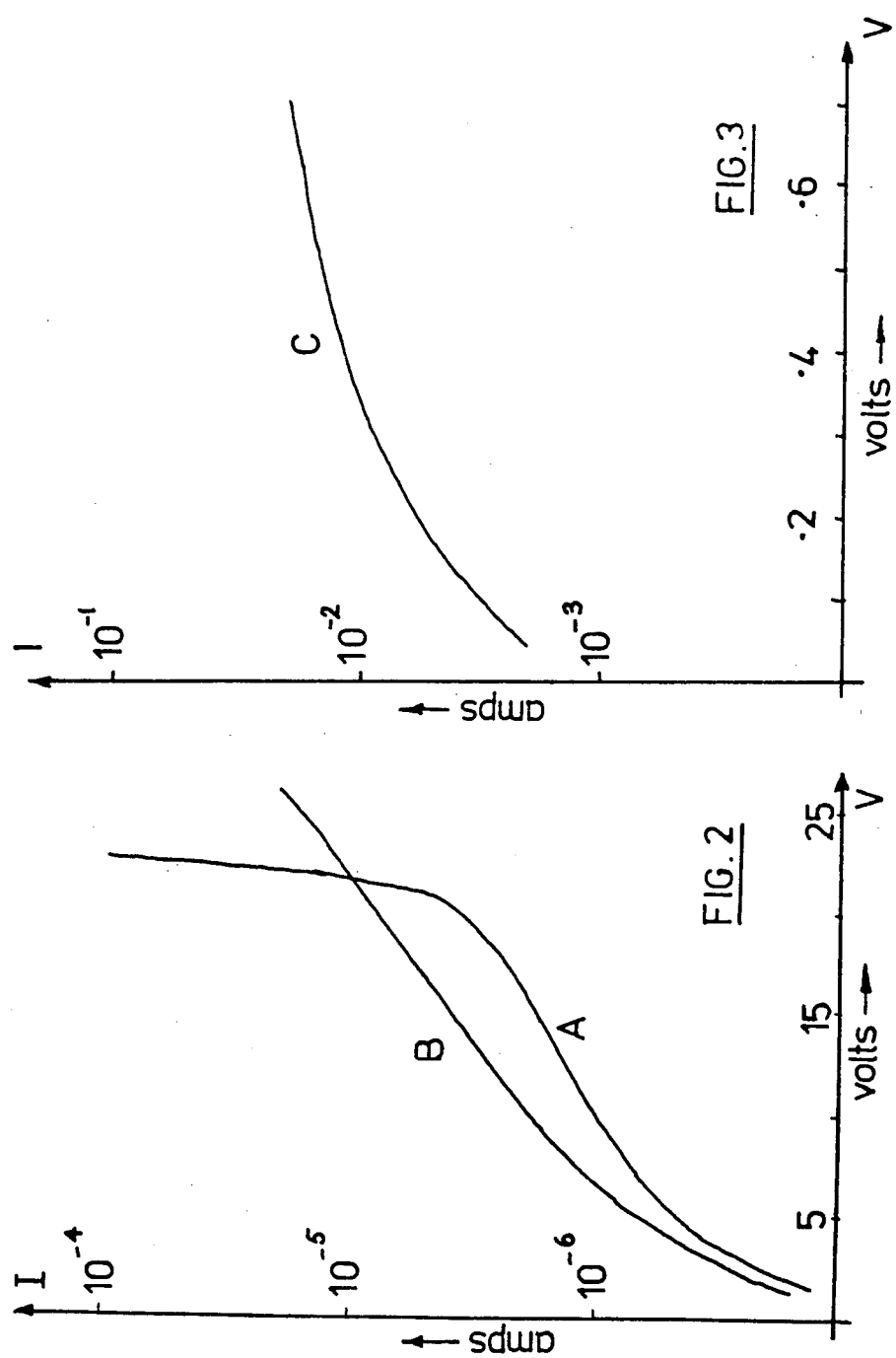

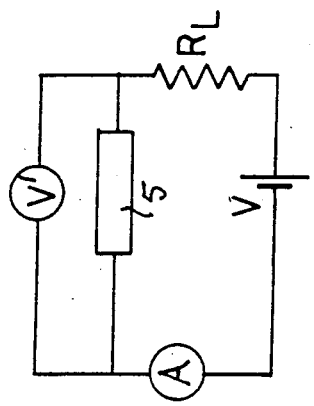
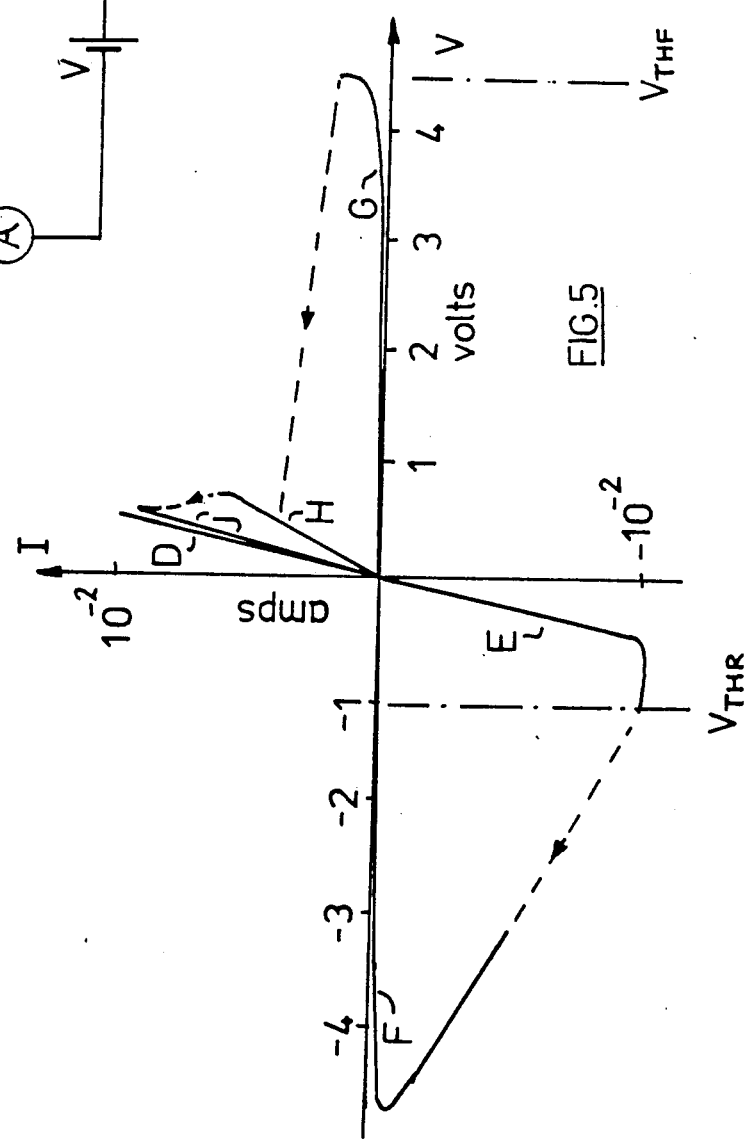

NON-VOLATILE AMORPHOUS SEMICONDUCTOR MEMORY DEVICE UTILIZING A FORMING VOLTAGE

RELATED APPLICATION

The present application is a continuation of U.S. application Ser. No. 405,395 filed Aug. 5, 1982, now abandoned.

IMPROVED SEMICONDUCTOR DEVICE

This invention relates to an improved semiconductor device which is based on structures of appropriately doped amorphous semiconducting material (e.g. silicon) and has great potential, inter alia, as a non-volatile electrically-programmable memory device.

The present invention seeks to provide a semiconductor device whose conductance can rapidly be changed electrically from a high value (ON-STATE) to a very low value (OFF-STATE) and vice versa, when an appropriate voltage pulse is applied thereto, the last "state" (either ON or OFF) of the device being preserved when the electrical bias is removed.

According to the present invention a semiconductor device comprises superimposed layers of p- and n-doped amorphous semiconducting material, one of said layers being much more heavily doped than the other, and electrical contact means for applying an electrical potential across the superimposed layers.

Preferably the semiconducting material is tetrahedrally bonded element or compound typified by silicon but other tetrahedrally bonded semiconducting materials such as germanium or semiconducting compounds of elements of Groups III and V of the Periodic Table can also be used.

The thickness of the less heavily doped layer should not exceed a critical value. In a typical realisation of a device according to the invention, a maximum thickness for the less heavily doped layer is believed to be about 2 $\mu$m.

Typically the dopant concentration of one layer would be one hundred or more times the dopant concentration in the other layer.

Normally one of said layers would be applied directly on a self-supporting substrate which provides one electrical contact means for the layers. The superimposed layers can be formed by first depositing appropriately doped amorphous silicon onto such a substrate, using a first mixture of reactant gases, and then when the desired first layer thickness has been deposited, changing the mixture of reactant gases to deposit the second layer directly on the first. The second electrical contact means can be applied directly to the second layer (e.g. by evaporation of conducting metal thereon) or applied to a third layer of quasi-intrinsic amorphous silicon overlying the second layer.

A device according to the invention may consist of three layers, the above mentioned p- and n-layers, followed by a third undoped (quasi-intrinsic), but capable of being doped n or p type amorphous semiconducting material (e.g. preferably a tetrahedrally bonded material such as silicon) layer (designated the "i" layer) which can be very thin and may be produced, also, by direct deposition from a gas phase. Alternatively, the third layer may be fabricated from an appropriate insulating material such as, for example, silicon dioxide.

The more heavily doped layer may include an n- or p-doping impurity at a concentration in the range $10^3$ to $10^4$ ppm (parts per million of silicon). The more heavily doped layer could have a thickness of the order of 0.1 $\mu$m and the less heavily doped layer could be some 4 to 10 times thicker.

According to a further aspect of the invention, an electrically-programmable non-volatile semiconductor memory device comprises superimposed layers of p- and n-doped amorphous semiconducting material (e.g. silicon), one of said layers being much more heavily doped than the other, a substrate supporting said layers, and contact means to permit the application of an electrical potential across the layers, the electrical properties of the device having been permanently modified by the application of a sufficiently large electrical potential between said contact means to dramatically reduce the electrical resistance of the said layers. The process by which the electrical properties are permanently modified will herein be referred to as "forming".

The potential required for "forming" the device will vary within wide limits, but is typically of the order of 20 to 30 volts d.c., or substantially higher potentials under pulsed conditions, and the reduction in resistance resulting from this "forming" will be of the order of a factor of $10^{-4}$.

Figure 7A:
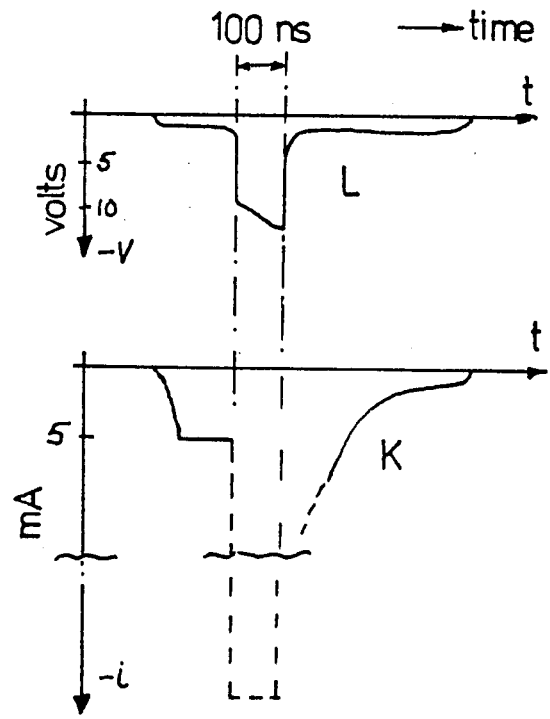
Figure 7B:
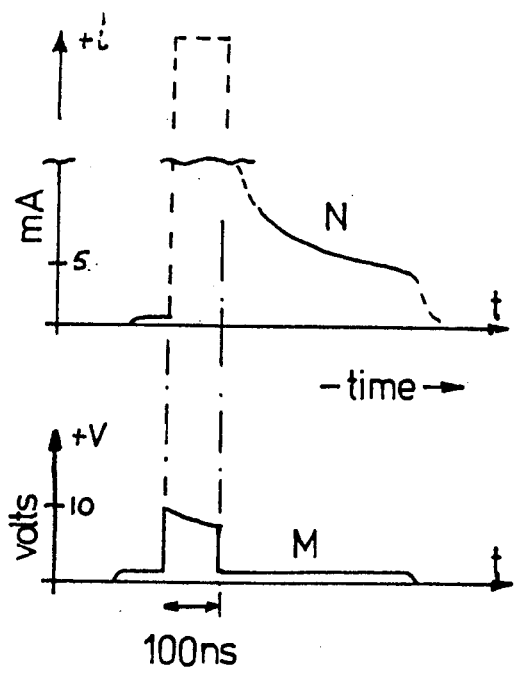
Figure 6:
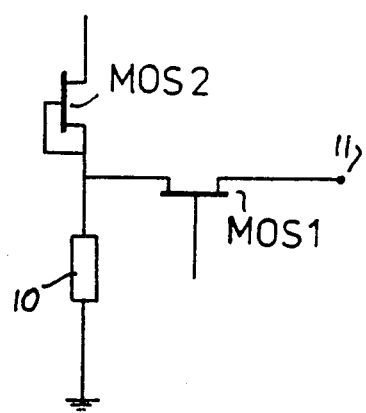

The invention will now be further described, by way of example, with reference to the accompanying drawings, in which:

FIG. 1 is a schematic sectional view of a device in accordance with the invention, FIG. 2 is a current-voltage curve of an unformed device, FIG. 3 is a current-voltage curve of a "formed" device, FIG. 4 is a circuit diagram showing how a "formed" device can be used as a non-volatile memory switch, FIG. 5 is a further current-voltage curve showing the properties of a "formed" device, FIG. 6 is a further circuit diagram for using a "formed" device, and FIGS. 7a and 7b show the pulse response for "write" and "erase" operations on a "formed" device used as a memory.

A basic device structure in accordance with the invention thus, in essence, comprises an appropriate sequence of layers of amorphous silicon. For the purpose of illustration the device described with reference to FIG. 1 of the drawings is an amorphous $p^+$-n structure (the superscript + means "heavily doped"). Electrical characteristics similar to the $p^+$-n structure of FIG. 1 are also found with $p^+$-n-i structures (where i means an undoped amorphous silicon layer or an "insulator" layer) and with $n^+$-p or $n^+$-p-i structures, these and other related configurations or configurations of n, p and i layers are also to be taken to be within the scope of this invention.

The embodiment of a $p^+$-n device illustrated schematically in FIG. 1, is fabricated on a stainless steel substrate 1. Amorphous silicon is prepared by the glow discharge technique and a $p^+$ layer 2 is first deposited onto the substrate 1 by doping the reactant gases with diborane. An n-layer 3 is grown subsequently on the $p^+$-layer 2 by doping with phosphine. Other dopant gases or doping by ion implantation may also be used. A small metal contact 4 is applied to the top of the n-layer 3 and gold, aluminium or stainless steel can be used for this purpose.

In a typical example, the thicknesses of the p+- and n-layers are approximately 0.15 μm and 0.7 μm, respectively, and the surface area of the device, as defined by the small top metal contact 4, is in the range of approximately $10^{-5}$ cm$^2$ to $10^{-2}$ cm$^2$. The doping concentration in the layer 2 is $10^4$ ppm and in the layer 3 it is 30 ppm.

Similar characteristics to those described below for this typical example, have also been observed in structures having an n-layer with thicknesses in the range 0.5 μm to 1.0 μm.

Immediately after fabrication, the device has the current-voltage characteristics depicted in FIG. 2 and labelled A and B for positive and negative voltages applied to the conducting substrate. In both states in FIG. 2 the combined impedance of the semiconductor layers such as the layers 2 and 3 in FIG. 1, is greater than one megohm.

When a positive bias is applied to the substrate and it exceeds a certain value—typically 20 to 30 V d.c., for a p+-n-i device or substantially higher potentials under pulsed conditions—the current increases drastically and the device switches to a new conductance state C (the impedance may be as low as 50Ω), illustrated in FIG. 3.

This switching to a new conductance state ("forming") occurs only for a positive voltage applied to the substrate and the former state cannot subsequently be restored electrically even if a very high positive or negative voltage is applied.

The "formed" device (shown at 5 in FIG. 4) can function as a reproducible electrically-programmable memory switch by including a current-limiting series load resistor $R_L$ in the circuit.

The static I-V curve obtained by point-by-point measurements on a "formed" p+-n or p+-n-i device is represented in FIG. 5. Starting from zero, when a positive bias is applied to the substrate, the current follows the curve labelled (D) which is the same as the conductance state C of FIG. 3 (ON-STATE). On reversing the bias the I-V curve (E) is followed up to a reverse threshold voltage equal to $V_{THR} \simeq 1$ V. If the voltage applied to the device is increased beyond this value, the device switches to a new conductance state, labelled (F), with a very high impedance (OFF-STATE). When the voltage is reversed again to positive values the impedance remains high and the I-V curve labelled (G) is followed until at a forward threshold voltage $V_{THF} \simeq 4$ V the device switches through intermediate states (H), (J) back to the ON-STATE (D). As shown in FIG. 5, both conductance states, namely the ON-STATE and the OFF-STATE, pass through zero volts.

The cycle between the two states (ON and OFF) can be repeated at least $10^6$ times and the device characteristics are stable up to temperatures of at least 150° C.

With p+-n or p+-n-i devices, switching from the OFF- to the ON-STATE always occurs for positive voltage and the switching from the ON- to the OFF-STATE requires a negative voltage to the substrate contact.

A typical realisation of a circuit for achieving the memory function with a formed device 10 is illustrated in FIG. 6. Two states "0" and "1" are defined by the two possible conducting states of the device:

"0"—ON-STATE
"1"—OFF-STATE

WRITE operation: After selection of the memory point by a transistor MOS2 a "1" is written if a negative voltage pulse of height greater than 2 V is applied to the point 11 in FIG. 6.

ERASE operation: To ERASE a "1", and consequently to write a "0", a positive pulse of height greater than 5 V is applied to the point 11.

READ operation: To read the state of the memory, the bias across the device 10 itself is measured through a transistor MOS2. This voltage is defined by the state of the device 10, the impedance of the MOS1 transistor, and the magnitude of the applied voltage pulse.

One of the most important parameters of a semiconductor memory device is the speed of its WRITE and ERASE operations. A memory device in accordance with the invention has the advantage of exceptionally high speed for both WRITE and ERASE.

FIG. 7a illustrates WRITE transition (ON→OFF). It shows the current response (trace K) to a single negative voltage pulse (trace L) of height $\simeq 10$ V i.e. a pulse greater than $V_{THR}$. This pulse is superimposed on another pulse of height $\simeq 1$ V but much wider than the former, which is used to read the state of the device. Thus, starting from the ON-STATE a voltage pulse of width 100 ns induces the transition to the OFF-STATE, i.e. the WRITE operation occurs within 100 ns in this particular case. The final current decay to the OFF-STATE (curve K) is determined by the time constant of the measuring circuit.

In FIG. 7b the same result is represented for the ERASE operation. Starting from the OFF-STATE a positive switching pulse of width 100 ns (trace M) induces the transition to the ON-STATE (trace N). Thus, the ERASE operation is caused by a pulse of 100 ns duration.

In both of FIGS. 7a and 7b, the dashed parts of the current curves represent areas of an oscilloscope trace where the current change was too rapid to be recorded.

The times for the WRITE and ERASE operations can be reduced (e.g. to at least 20 ns) by increasing the magnitude of the voltage pulse.

The energy dissipated during either transition is extremely low, typically of the order of $10^{-8}$ J.

The mechanisms occurring in an amorphous silicon device as shown in FIG. 1 when operating as a memory are not fully understood, but it is suspected that current injection of carriers from the heavily doped layer 2 into the layer 3 causes the formation of conducting filaments within the amorphous layers which may be destroyed by a reverse potential and/or current.

The presence of an undoped layer—whose electrical properties are determined by the defect structure of the amorphous silicon (and not by doping)—on the layer 3 has been noted to stabilise the performance of a device.

From the foregoing, it will be appreciated that a device in accordance with the invention is an exceptionally fast semiconductor switch capable of application as a single-element memory cell in electrically-programmable and non-volatile random-access memory arrays. The WRITE and ERASE times of 100 ns or less, and the speedpower product (dissipated energy), are comparable with standard semiconductor memories based on MOS transistors or bipolar transistors, but both the latter are not electrically-programmable and conventional transistor technology requires several elements (transistors) per cell. Moreover, standard semiconductor memories do not retain their information when power is removed, i.e. they are "volatile".

The basic material and structure of a device in accordance with the invention are simple and could readily be incorporated into standard silicon microelectronics by, for example, using a silicon wafer as the substrate 1 in FIG. 1.

The only other single-element electrically-alterable and non-volatile semiconductor memories are the FAMOS, MNOS and OVONIC devices. The FAMOS and MNOS devices are inherently slow in WRITE and ERASE operations as they depend upon charge injection and storage in an insulating layer and since charge always leaks away at a finite rate, their retention time is not infinite. The OVONIC device is also very slow by comparison because its operation depends upon mass transport and crystal growth. In addition it utilises complex materials which are not readily compatible with established silicon technology.

The utilisation of amorphous silicon, rather than the single-crystal silicon wafers of currently standard technology, means that the new device could readily be applied to large-area memory arrays.

As an additional application for a device in accordance with the invention, the negative resistance characteristics of the new device (in the negative bias region—see FIG. 5) could be utilised as a circuit element for an oscillator.

The voltage levels required to operate a device in accordance with the invention could be made entirely compatible with those used in standard digital logic circuitry.

Although devices based on amorphous silicon have been described, the invention could also be applied to structures fabricated from amorphous germanium or other similar amorphous materials such as the III–V compounds.

What is claimed is:

1. A nonvolatile semiconductor memory device comprising a substrate, at least superimposed layers of p- and n-doped amorphous semiconductor material supported by the substrate, and electrical contact means for applying an electrical potential across the layers, said device being electrically formed to have a property of exhibiting at least two distinct conductance states of high and low conductance, respectively, at a predetermined range of applied voltages extending through zero volts and being repeatably switchable between said states by positive and negative switching voltages respectively of magnitude at least as great as given positive and negative threshold voltages.

2. A semiconductor device in accordance with claim 1 wherein said p- and n-doped amorphous semiconductor material comprises a tetrahedrally bonded material.

3. A semiconductor device as claimed in claim 2, in which the semiconductor material is silicon.

4. A semiconductor device as claimed in claim 1 wherein said device is electrically formed so that said layers of p- and n-doped amorphous semiconductor material exhibit said two distinct conductance states.

5. A semiconductor device as claimed in claim 1, 2 or 4, characterised in that one of the layers is less heavily doped and has a thickness which is not greater than 2 $\mu$m.

6. A semiconductor device as claimed in claim 1, 2 or 4, characterised in that the dopant concentration of one layer is one hundred or more times the dopant concentration of the other layer.

7. A semiconductor device as claimed in claim 1, 2 or 4, characterised in that one of the layers is less heavily doped and has an impurity concentration of the order of a few tens of parts per million and the more heavily doped layer has an impurity concentration of the order of $10^4$ ppm.

8. A semiconductor device as claimed in claim 1, 2 or 4, characterised in that one of the layers is more heavily doped than any other of the layers and has a thickness in the range of 0.1 $\mu$m to 0.2 $\mu$m and the less heavily doped layer is between 4 and 10 times thicker.

9. A semiconductor device according to claim 1, 2 or 4, said layers and substrate comprising a laminated structure whose property results from the application of a forming voltage thereto, in its high conductance state said device having a resistance which is not more than one-thousandth of the resistance of the laminated structure prior to the application of said forming voltage.

10. A semiconductor device according to claim 1, 2 or 4 wherein the device embodies a laminated structure formed by the application of a forming voltage sufficient to convert it into a device switchable between two conductance states, said laminated structure prior to forming being characterized by having a single conductance state.

11. A semiconductor device according to claim 10 wherein said laminated structure is permanently changed from its prior single conductance state by said application of predetermined forming voltage across the layers.

12. A semiconductor device according to claim 1 or 4 wherein the semiconductor material is at least one material selected from the group consisting of silicon, germanium and a semiconducting compound of elements of Groups III and IV of the Periodic Table.

13. A semiconductor device according to claim 1, 2 or 4 wherein the device is switched from one conductance state to the other in response to an application of a positive switching voltage of magnitude at least as great as said positive threshold voltage across the layers and wherein further the conductance state is maintained until application of a negative switching voltage of magnitude at least as great as said negative threshhold voltage across the layers.

14. A semiconductor device according to claim 13 wherein the device is operable to switch from the high conductance state to the low conductance state in response to the application of a predetermined negative switching voltage of magnitude at least as great as said negative threshold voltage across the layers and is operable to switch from the low conductance state to the high conductance state in response to the application of a predetermined positive switching voltage of magnitude at least as great as said positive threshhold voltage across the layers.

15. A semiconductor device as claimed in claim 1, 2 or 4 comprising a third layer of substantially undoped amorphous semiconductor material capable of being doped p or n type applied to one of the doped layers between the doped layer and its electrical contact means.

16. A nonvolatile semiconductor memory device comprising a substrate, superimposed layers of p- and n-doped amorphous semiconductor material supported by the substrate, a third layer of substantially undoped amorphous semiconductor material capable of being doped n or p type applied to one of the doped layers and electrical contact means for applying an electrical potential across the layers, said device being electrically formed to have the property of exhibiting at least two distinct conductance states of high and low conductance, respectively, at a predetermined range of applied voltages extending through zero volts and being repeatably switchable between said states by positive and negative switching voltages respectively of magnitude at least as great as given positive and negative threshhold voltages.

17. A semiconductor device as claimed in claim 16 wherein each of said layers comprises tetrahedrally bonded material.

18. A semiconductor device as claimed in claim 17, in which the semiconductor material is silicon.

19. A semiconductor device as claimed in claim 16 wherein said device is electrically formed so that said layers of p- and n-doped amorphous semiconductor material and said layer of substantially undoped amorphous semiconductor material exhibit said two distinct conductance states.

20. A semiconductor device as claimed in claim 16, 17 or 19, characterised in that one of the doped layers is less heavily doped and has a thickness which is not greater than 2 $\mu$m.

21. A semiconductor device as claimed in claim 16, 17 or 19 characterised in that the dopant concentration of one of the doped layers is one hundred or more times the dopant concentration of the other doped layer.

22. A semiconductor device as claimed in claim 16, 17 or 19, characterised in that one of the doped layers is less heavily doped and has an impurity concentration of the order of a few tens of parts per million and the more heavily doped layer has an impurity concentration of the order of $10^4$ ppm.

23. A semiconductor device as claimed in claim 16, 17 or 19, characterised in that one of the doped layers is more heavily doped than any other of the layers and has a thickness in the range of 0.1 $\mu$m to 0.2 $\mu$m and the less heavily doped layer is between 4 and 10 times thicker.

24. A semiconductor device according to claim 16, 17 or 19, said layers and substrate comprising a laminated structure whose property results from the application of a forming voltage thereto, in its high conductance state said device having a resistance which is not more than one-thousandth of the resistance of the laminated structure prior to the application of said forming voltage.

25. A semiconductor device according to claim 16, 17 or 19 wherein the device embodies a laminated structure formed by the application of a forming voltage sufficient to convert it into a device switchable between two conductance states, said laminated structure prior to forming being characterized by having a single conductance state.

26. A semiconductor device according to claim 25 wherein said laminated structure is permanently changed from its prior single conductance state by said application of a predetermined forming voltage across the layers.

27. A semiconductor device according to claim 16 or 19 wherein the semiconductor material is at least one material selected from the group consisting of silicon, germanium and semiconducting compound of elements of Groups III and IV of the Periodic Table.

28. A semiconductor device according to claim 16, 17 or 19 wherein the device is switched from one conductance state to the other in response to an application of a positive switching voltage of magnitude at least as great as said positive threshold voltage across the layers and wherein further the selected conductance state is maintained until application of a negative switching voltage of magnitude at least as great as said negative threshhold voltage across the layers.

29. A semiconductor device according to claim 28 wherein the device is operable to switch from the high conductance state to the low conductance state in response to the application of a predetermined negative switching voltage of magnitude at least as great as said negative threshold voltage across the layers and is operable to switch from the low conductance state to the high conductance state in response to the application of a predetermined positive switching voltage of magnitude at least as great as said positive threshhold voltage across the layers.

* * * * *